(12) United States Patent
Aurand et al.

(10) Patent No.: US 12,248,006 B2
(45) Date of Patent: Mar. 11, 2025

(54) DETERMINATION OF AN UNBALANCED LOAD IN A HIGH-VOLTAGE SYSTEM AND REACTION TO THE SAME

(71) Applicant: MERCEDES-BENZ GROUP AG, Stuttgart (DE)

(72) Inventors: Tobias Aurand, Ludwigsburg (DE); Markus Zimmer, Leinfelden-Echterdingen (DE)

(73) Assignee: MERCEDES-BENZ GROUP AG, Stuttgart (DE)

( * ) Notice: Subject to any disclaimer, the term of this patent is extended or adjusted under 35 U.S.C. 154(b) by 204 days.

(21) Appl. No.: 18/013,587

(22) PCT Filed: Jun. 25, 2021

(86) PCT No.: PCT/EP2021/067570
§ 371 (c)(1),
(2) Date: Dec. 29, 2022

(87) PCT Pub. No.: WO2022/002800
PCT Pub. Date: Jan. 6, 2022

(65) Prior Publication Data
US 2024/0036078 A1    Feb. 1, 2024

(30) Foreign Application Priority Data

Jul. 1, 2020   (DE) .................... 10 2020 003 948.0
Nov. 11, 2020  (DE) .................... 10 2020 006 919.3

(51) Int. Cl.
| G01R 27/08 | (2006.01) |
| G01R 15/16 | (2006.01) |
| G01R 27/26 | (2006.01) |

(52) U.S. Cl.
CPC ....... G01R 15/165 (2013.01); G01R 27/2605 (2013.01)

(58) Field of Classification Search
CPC .................... G01R 27/2605; G01R 15/165
See application file for complete search history.

(56) References Cited

U.S. PATENT DOCUMENTS

2020/0127469 A1    4/2020   Haindl et al.

FOREIGN PATENT DOCUMENTS

| DE | 102018002926 A1 |   | 9/2018 |
| DE | 102017218586 A1 |   | 4/2019 |
| DE | 102017220982 A1 |   | 4/2019 |
| DE | 102018211625 A1 | * | 1/2020 |

OTHER PUBLICATIONS

International Search Report and Written Opinion mailed Oct. 21, 2021 in related/corresponding DE Application No. PCT/EP2021/067570.

* cited by examiner

*Primary Examiner* — Alesa Allgood
(74) *Attorney, Agent, or Firm* — PATENT PORTFOLIO BUILDERS PLLC

(57) ABSTRACT

For an electrical unbalanced load of a vehicle having an at least partially electrified drive train with at least one high-voltage system, information about a value characterizing an energy quantity of a Y capacitor of the high-voltage system is determined. The information about the electrical unbalanced load is finally determined by comparing the determined characterizing value with a threshold value.

Figure 1:
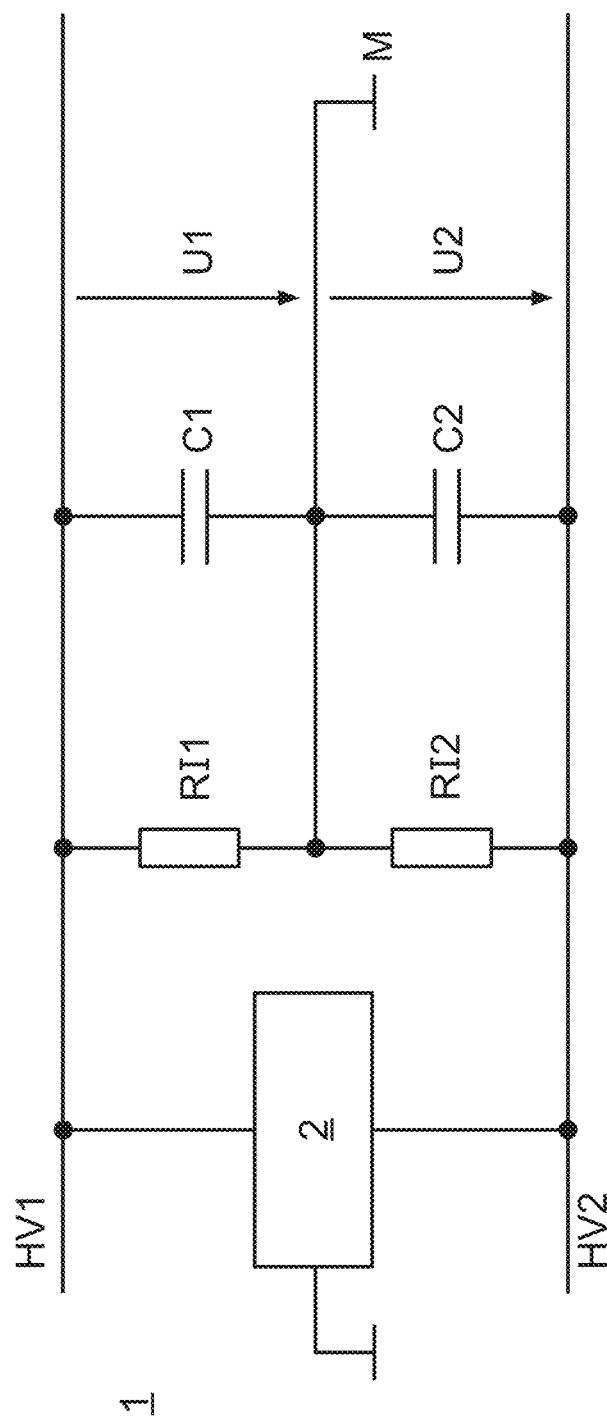

6 Claims, 3 Drawing Sheets

DETERMINATION OF AN UNBALANCED LOAD IN A HIGH-VOLTAGE SYSTEM AND REACTION TO THE SAME

BACKGROUND AND SUMMARY OF THE INVENTION

Exemplary embodiments of the present invention relate to a method for determining information about an electrical unbalanced load of a vehicle having an at least partially electrified drive train that has at least one high-voltage system. Exemplary embodiments of the present invention additionally relate to a method for reacting to information of this kind about the electrical unbalanced load, as well as to a corresponding high-voltage system for an electric motor vehicle and an electric motor vehicle having a high-voltage system of this kind.

X and Y Capacitors

In simple terms, there are two kinds of capacitors in electric drive systems, so-called X capacitors and so-called Y capacitors. While X capacitors are switched between the HV potentials (i.e., between HV+ and HV−), and there exercise a buffer function, Y capacitors are switched from every HV potential according to vehicle mass, and function as so-called "anti-interference capacitors". Many components (especially the HV battery) additionally form so-called parasitic Y capacitors due to their construction principles, i.e., a capacitance develops between the respective HV potentials and the vehicle mass.

While HV vehicles represent so-called II or IT network systems with regards to the energy distribution systems, and are thus single-fault protected per se with regards to dangers from the electrical current or the electrical voltage in the event of touching, only the energy stored in the Y capacitors thus remains a source of danger to be taken into account in the event of a single fault, as the total energy of all the Y capacitors attached to an HV potential is diverted over the body if the potential (either HV+ or HV−) is touched.

The problem of variable Y capacitors occurs in particular in the commercial vehicle sector. It is usual there to provide a base vehicle with different superstructures, e.g., a crane, cooling system, etc. The superstructures are optionally removed, rebuilt, or additionally developed. The entire Y capacitance of the vehicle resulting from the sum of all the individual Y capacitances of the superstructures thus changes. Therefore, if a "Y capacitance" or "Y capacitor" is referred to in the following document, then as a rule, the sum of all the parasitically or discretely effective Y capacitances or Y capacitors per HV potential according to vehicle mass is meant.

There are norms and standards regulating and limiting the maximum energy quantity that can be stored in Y capacitors in order to minimize the dangers or probabilities of harm to health connected thereto. This means that a strict observation of these limits is relevant to authorization. If these limits cannot be observed for whatever reason, then the vehicle either cannot be authorized (preventing market entry) or extremely substantial construction measures must be taken in order to prevent a potential touching of the HV potentials. While this is technically possible, it is very complex, i.e., corresponding measures entail construction complexity (and thus difficulty of maintenance), and the negative effects on the vehicle weight and substantial additional costs connected thereto. This should therefore be avoided.

Energy in the Capacitor

The constantly increasing system voltage of the electric drive system (especially in the commercial vehicle sector) also considerably exacerbates the problem, as the energy quantity stored in a capacitor (of a constant size) increases with the square of the capacitor voltage. This means that the following applies:

$$W_{capacitor} = \tfrac{1}{2} \cdot C \cdot U^2$$

wherein W is the stored energy, C is the capacitance of the capacitor and U is the voltage on the capacitor already mentioned. In concrete terms, this means that if the system voltage in the HV system increases from 400V to 800V, then the sum of the capacitances permitted per HV potential is only a quarter of the previous value. This is inconvenient, as the higher voltage level is often also associated with or must be associated with shorter switching times of semiconductor components in order to limit the thermal switching losses occurring during switching. On the other hand, however, shorter switching times lead to so-called steeper switching flanks, these lead to more interferences that have to be diverted (see "Y capacitors are anti-interference capacitors" above), and thus generally lead to the requirement for larger Y capacitors. i.e., a contrary development that is twice as inconvenient is present here.

Isolation Resistances in HV Systems

As already mentioned previously, HV systems are so-called II or IT systems, i.e., they have no relation to vehicle mass (compare a pocket torch, here the system is only related to the plus or minus pole of the pocket torch batteries, but not to any form of mass potential). The HV potentials can thus ideally be described as undefined or "floating" with regards to the vehicle mass. This is desirable and forms the basis of the single-fault protection likewise previously mentioned.

As all isolating materials used in reality have a resistance, however, (even if it is very high) a high-resistance connection of both HV potentials to the vehicle mass is present in systems of this kind too. These undesirable resistances, which are not incorporated as a component, but rather are purely parasitic, are called isolation resistances.

As these isolation resistances cannot fall short of a certain value, as the protecting character of the II or IT systems no longer exists, the isolation resistances are measured by means of an isolation measuring device that is called an ISO monitor. Although the observation of certain isolation resistance limits may also be relevant to authorization, it is irrelevant for this invention.

As can be seen in FIG. 1, the resistances Riso_HV+ and Riso_HV− represent a voltage divider over the HV voltage. In the course of a vehicle lifespan, a change of the isolation resistances usually occurs, principally via aging, respective worsening, of the isolation materials. While the isolation resistances in both potentials are usually approximately the same in the case of a new vehicle, and likewise worsen to the same extent, it may be the case (and indeed is the case in practice) that the isolation resistance of one of the potentials changes faster than the isolation resistance of the other potential, which then leads to an "unbalanced load" or "unbalance" of the isolation resistances.

In other words, in an ideal new vehicle, in which both isolation resistances are equally large, the HV voltage is equally split over the voltage divider, i.e., the voltage of each of the HV potentials according to vehicle mass is equally large in magnitude. If the "unbalanced load" occurs as described above, then the resistance relationship thus shifts, and so too the division of the HV voltage, i.e., the voltage of an HV potential according to vehicle mass is larger in magnitude than the magnitude of the voltage of the other potential according to mass.

Isolation Resistances and Y Capacitors

If the two topics given above, Y capacitors and isolation resistances, are combined with each other, then the right-hand part of the switching image in FIG. 1 results.

It can be seen that the Y capacitors respectively lie in parallel to the isolation resistances (i.e., are switched in parallel), and they are thus charged to the voltage that is introduced via the voltage divider of the isolation resistances. Herein also lies the problem to be improved by the invention. If the relationship of the isolation resistances to each other shifts due to changes (see aging), then the voltage on the capacitors also shifts. Due to the generally relatively high isolation resistances in systems of this kind, and the "relatively" low legally required switch-off threshold when isolation resistances are fallen short of in relation to said isolation resistances, it can occur in the case of extremely "unbalanced loads" that almost the entire voltage of the HV system lies on one of the two capacitors.

This means that (almost) the maximum HV voltage occurring in the system must be drawn on in the case of the maximum Y capacitances, as the voltage can fall approximately entirely over the Y capacitor of one potential in the worst-case scenario. Because, as mentioned above, the voltage having the square enters the energy stored in the capacitor, it is significantly disadvantageous, and leads, for example, to a situation in which, for systems having up to 850V system voltage, 425V cannot be used for the calculation (ideal system), but rather the full 850V. The maximum Y capacitance per potential resulting from this is then so low that either it is not possible to meet EMV norms, substantial thermal losses are to be expected due to longer switching times (optionally technically limited or partially impossible), the system voltage decreases (counteracts the idea of effective 850V systems for commercial vehicles) or, as mentioned above, significant construction, and thus expensive, load capacitance reducing measures have to be taken.

As mentioned above, it can thus be advantageous to provide Y capacitances that are as high as possible in a high-voltage system for an electric motor vehicle. For example, thermal losses can thus be reduced, switching times can be reduced or higher system voltages can be used. On the other hand, as described, an unbalanced load can occur due to component aging, in which different voltages lie on the Y capacitances of different high-voltage potential connections of the high-voltage system. In the most inconvenient case, the entire system voltage lies on one potential side of the high-voltage system. The maximum energy quantity that can be stored in the Y capacitors is limited, however, for technical safety reasons. Samples must therefore be taken when the Y capacitors are designed due to the unbalanced load in order to still be able to depict the borderline case of maximum unbalanced load. The maximum capacitance of the Y capacitors is finally thus limited.

Against this background, exemplary embodiments of the present invention are directed to an improved concept for a high-voltage system of an electric motor vehicle.

The improved concept is based on the idea of determining an unbalanced load based on the energy quantity in a Y capacitor. It is possible to react to the unbalanced load by reducing the energy quantity.

According to the improved concept, a method is provided for determining first information about an electrical unbalanced load of a vehicle having an at least partially electrified drive train that has at least one high-voltage system. First, a value characterizing an energy quantity of the Y capacitor of the high-voltage system is determined. A first threshold value in relation to a capacitance of the Y capacitor is then provided. Finally, the first information about the electrical unbalanced load is determined by means of comparison of the determined characterizing value with the provided first threshold value.

According to the improved concept, a method is provided for reacting to first information about an electrical unbalanced load of a vehicle having an at least partially electrified drive train that has at least one high-voltage system. In this case, a first measure is introduced depending on the first information, whereby an energy quantity of a Y capacitor affecting the unbalanced load is reduced.

According to the improved concept, a high-voltage system for an electric motor vehicle having a Y capacitor is also provided. The high-voltage system has an analysis device for determining a value characterizing an energy quantity of a Y capacitor of the high-voltage system, and for providing a first threshold value in relation to a capacitance of the Y capacitor. The high-voltage system also has a computing device for determining the first information about the electrical unbalanced load by means of comparison of the determined value with the provided first threshold value.

According to the improved concept, an electric motor vehicle having a high-voltage system according to the improved concept is also provided.

A first high-voltage potential connection (e.g., HV+) can, for example, be connected to a first output of a high-voltage battery of the high-voltage system here, and the second high-voltage potential connection (HV−) can be connected to a second connection of the high-voltage battery that has an opposite polarity in comparison with the first connection of the high-voltage battery.

It is true that the high-voltage system does not generally have a direct mass connection, and is thus floating, so to speak, such that the first high-voltage potential connection and the second high-voltage potential connection essentially only have a potential difference that represents the voltage in the high-voltage system. However, as the high-voltage system can still be connected to a vehicle mass connection of the motor vehicle in a high-resistance manner via Y capacitors and isolation resistances, for example, a mass reference of the high-voltage system thus mostly results. It is thus still also possible to talk about HV+ for the first high-voltage potential connection, and to talk about HV− for the second high-voltage potential connection, for example, without having to directly refer to a mass or zero length here, or without even implying a symmetrical pole difference for this purpose. This formulation is maintained for ease of understanding, and correspondingly an opposing polarity continues to be the basis worked from without thus limiting the high voltage.

According to the method or in a high-voltage system according to the improved concept, a value characterizing an energy quantity of a Y capacitor of the high-voltage system is thus determined. This characterizing value may be the actual energy quantity or a value from which the energy quantity can be clearly determined. The characterizing value can thus optionally be evaluated as a representative of the actual energy quantity in the Y capacitor. The Y capacitor optionally forms the sum of several Y individual capacitors.

A first threshold value in relation to a capacitance of the Y capacitor is also provided in the method. This means that the first threshold value is practically provided as a function of the capacitance of the Y capacitor. It is necessary that the first threshold value depends on the size of the capacitance of the Y capacitor, as the first threshold value is used to evaluate the unbalanced load. This is because the more Y capacitance is installed in the vehicle, the lower the unbalanced load can be. This is immediately obvious, as the unbalanced load represents the voltage division relationship of the voltages on the Y capacitors to the high-voltage potential connections. A high unbalanced load leads to a correspondingly high partial voltage on the corresponding Y capacitor, and thus to a correspondingly high energy content. A high unbalanced load thus cannot represent a danger in the case of small capacitance, while it certainly does in the case of higher capacitance. The first threshold value can be provided by means of a look-up table or an analytical function.

In the method according to the improved concept, the first information about the electrical unbalanced load is finally determined by means of comparison of the determined characterizing value with the provided first threshold value. The result of the comparison thus leads to the first information, which may, for example, be binary, depending on whether the characterizing value is larger or smaller than the first threshold value. This first information can then be used to correspondingly react automatically by introducing suitable measures, and, in the simplest case, by the driver only being warned.

In an advantageous embodiment of the method according to the invention, i.e., in the improved concept, it can be provided that the value characterizing the energy quantity is a voltage or a partial voltage of the high-voltage system or a value relating to the latter, a relationship of voltages of the high-voltage system or a relationship of isolation resistances of the high-voltage system. This is because if the entire voltage of the high-voltage system is known, then a determined voltage value results on a Y capacitor in an initial state (e.g., in the case of given isolation resistances). If this voltage or the voltage value changes, then the voltage on the respective other high-voltage potential changes corresponding to the voltage distribution relationship. The respective individual voltage can be re-calculated into the corresponding energy quantity in the event of a known capacitance. If the voltage thus increases above a given voltage threshold value, then the energy in the capacitor also increases above a corresponding energy threshold value. If the voltage decreases, this is a sign that the voltage on the Y capacitor for the other high-voltage potential is correspondingly increasing. The decrease of the voltage thus also means an unbalanced load, and possibly a danger.

Of course, the entire voltage between the mass and the respective high-voltage potential does not necessarily need to be considered for the voltage analysis, as a partial voltage (e.g., on a corresponding voltage divider) of the high-voltage system can represent the respective entire voltage. Alternatively, however, a value relating to the voltage can also be determined as a characterizing value. A current could optionally be a related value of this kind, for example, or also any variable that can be translated into a voltage value with a pre-determined function or relationship.

The value characterizing the energy quantity can additionally be a relationship of voltages of the high-voltage system. It can, in particular, be the relationship of the entire voltages of the mass to the respective high-voltage potential. The latter voltage relationship represents the unbalanced load directly, such that in this case an actual unbalanced load can be compared with an unbalanced load limit value. Analogously to this, a relationship of isolation resistances of the high-voltage system can also be immediately determined as a characterizing value. It is particularly advantageous here if the respective isolation resistances represent the entire resistance of mass to the respective high-voltage potential connection. This relationship of the isolation resistances also represents the unbalanced load directly.

In a further development of the method, a further step is provided, specifically determining second information about the electrical unbalanced load by means of comparison of the determined value with a provided second threshold value different from the first threshold value in relation to the capacitance of the Y capacitor. This means that the determined characterizing value is compared with two different threshold values. Two different comparison results thus result, which lead to the first information and the second information. These two sets of information can be used for a cascade of reactions. Naturally, a comparison with the third threshold value etc. can optionally also be carried out.

As mentioned above, the method according to the invention corresponding to the improved concept can provide that the first information is reacted to via the electrical unbalanced load. In particular, a first measure should be introduced depending on the first information in order to reduce an energy quantity of a Y capacitor affecting the unbalanced load. The first information can be obtained here by a method as explained above. The first information is thus not only obtained and optionally provided, but an adequate reaction also occurs here.

Automatically switching off the entire high-voltage system may be a possible reaction as the first measure. This automatic switching-off of the high-voltage system means that, for example, the high-voltage connections of the high-voltage system are separated from the high-voltage battery. It is true that, at this point in time, the voltages still lie on the capacitors, but discharging can occur via active and/or passive discharging devices, or the isolation resistances also represent a very high-resistance connection. The Y capacitors can optionally also be discharged in a targeted manner through additional measures in the automatic switching off.

A first measure as a reaction to an undesirable unbalanced load may also be a de-coupling of a partial network from the high-voltage system. A cooling system of a vehicle structure can thus be split from the high-voltage system as a partial network, for example. The entire Y capacitance thus decreases, whereby the energy quantity in the entire Y capacitance is also reduced.

Alternatively, or additionally, a voltage on the Y capacitors can also be reduced as a first measure. The energy in the Y capacitor is also reduced when the voltage is reduced using means standard for the person skilled in the art. However, a reduction of the system voltage or the energy usage can also serve as measures for this purpose, for example, as can a limitation of the maximum charging voltages or system voltage.

Furthermore, as an alternative or in addition, an isolation resistance on the Y capacitor can be reduced, in particular by introducing, removing, connecting, or disconnecting one or more correction resistances. In any case, a resistance is introduced to the existing isolation resistance in such a way, or separated from the latter in such a way that the unbalanced load or unbalanced position is minimized. The energy quantity in the respective Y capacitor can thus not exceed a pre-determined highest value.

In a further development of the method according to the invention, it can also be provided that a second measure, in particular a warning, is introduced depending on the second information, whereby the energy quantity of the Y capacitor affecting the unbalanced load is not reduced. While the energy quantity in the Y capacitor is thus reduced with the first measure, this is not the case in the second measure. This is especially advantageous for purely precautionary measures in which the driver is given advance warning of a potential danger, for example. Further measures can naturally also be introduced here optionally depending on further threshold values. A cascade of measures can thus be provided in relation to reactions to an unbalanced load.

In a particularly advantageous embodiment of the method, it is provided that the provision of the first threshold value includes determining an entire capacitance of the Y capacitor, and determining the first threshold value depending on the entire capacitance. The entire capacitance can, in particular, be determined automatically. It is thus possible to determine the current entire capacitance of the Y capacitor at certain points in time, and to adjust the threshold values to the entire capacitance accordingly. It is thus possible to constantly react to an aging of the entire Y capacitor, for example.

BRIEF DESCRIPTION OF THE DRAWING FIGURES

Further advantages, features and details of the invention can be seen in the following description of preferred exemplary embodiments and by reference to the drawings. The features and combinations of features specified previously in the description, and the features and combinations of features specified in the description of figures in the following and/or shown in the figure alone can be used not only in the respectively provided combinations, but also in other combinations or in isolation without leaving the scope of the invention.

Figure 2:
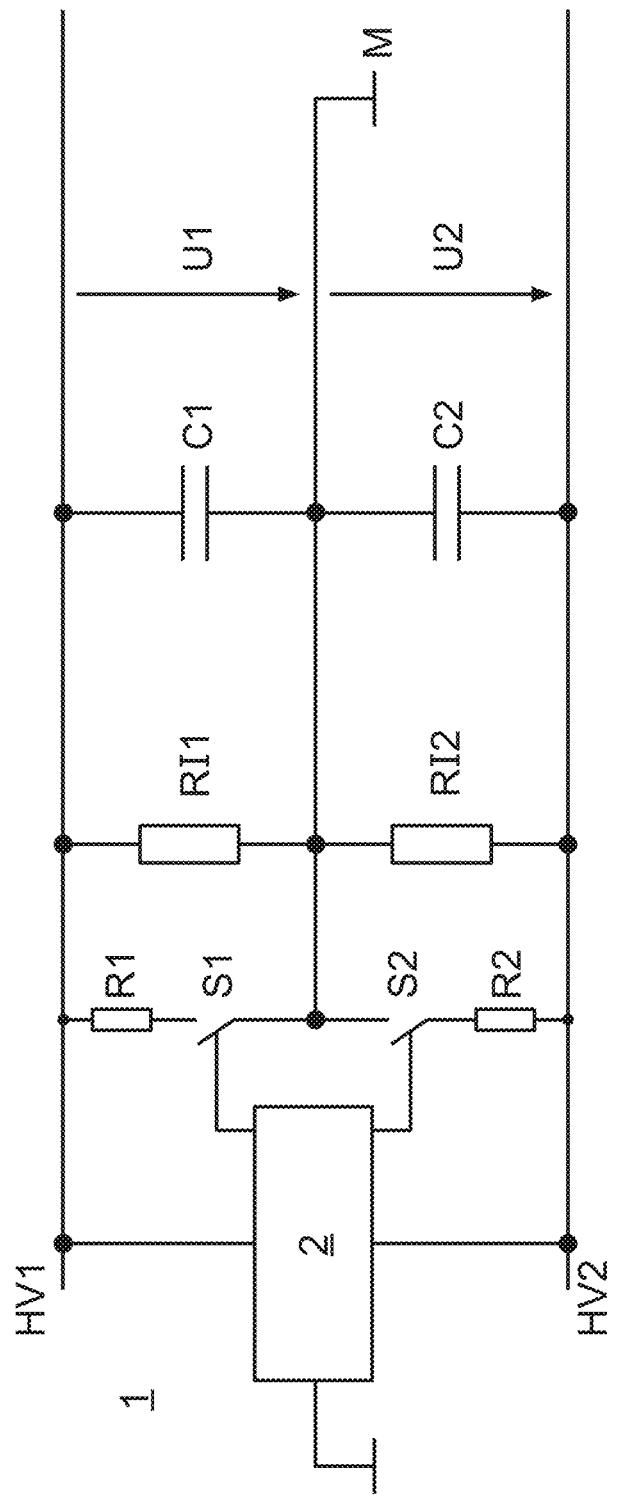
Figure 3:
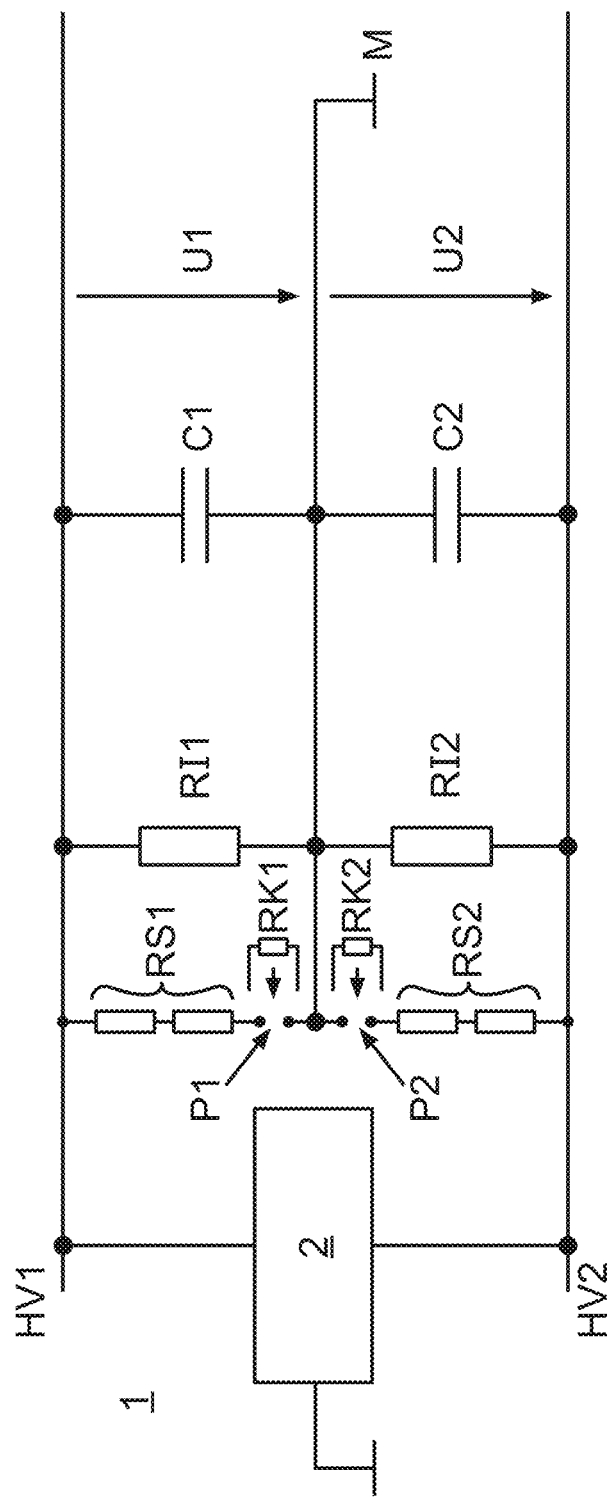

In the figures:

FIG. 1 shows a schematic depiction of an exemplary embodiment of a high-voltage system according to the improved concept, FIG. 2 shows a schematic depiction of an alternative embodiment of a high-voltage system according to the improved concept; and FIG. 3 shows a schematic depiction of a further exemplary embodiment of a high-voltage system according to the improved concept.

Identical elements or elements having an identical function are given identical reference signs in the depictions.

DETAILED DESCRIPTION

In FIG. 1, an exemplary embodiment of a high-voltage system 1 for an electric motor vehicle (also described as "HV vehicles" in the following) is schematically depicted. The high-voltage system 1 has two high-voltage potential connections HV1, HV2 (also described as "HV potentials" in the following), having opposite polarity (e.g., HV+ and HV−) and a vehicle mass connection M (also described as "vehicle mass" in the following).

In a high-voltage system 1 of this kind, in particular in an electric drive system, in simple terms, there may be two kinds of capacitors, specifically X capacitors and Y capacitors. While the X capacitors can be switched between the HV potentials HV1, HV2 in order to carry out a buffer function, Y capacitors can be switched from each of the HV potentials HV1, HV2 according to vehicle mass M in order to function as so-called anti-interference capacitors. Many components, in particular the high-voltage battery, additionally form parasitic Y (partial) capacitors due to their construction principles. A(n) (entire) capacitance thus forms between the respective HV potentials HV1, HV2 and the vehicle mass M.

While HV vehicles represent so-called II or IT network systems with regards to an energy distribution system, and are thus single-fault protected per se with regards to dangers from the electrical current or the electrical voltage in the event of touching, the energy stored in the Y capacitors remains a source of danger to be taken into account in the event of a single fault, as the total energy of all the Y capacitors connected to an HV potential HV1, HV2 is diverted over the body if the potential is touched. All of the Y capacitors, including the parasitic Y capacitors, are schematically depicted in FIG. 1 as a first Y capacitor C1 between the first HV potential HV1 and the vehicle mass M and as a second Y capacitor C2 arranged between the second HV potential HV2 and the vehicle mass M.

The maximum energy quantity that can be stored in Y capacitors is limited in order to reduce the dangers connected with touching an HV potential HV1, HV2, or the probability of harm to health. It is true that construction measures to avoid possible touching of the HV potentials HV1, HV2 might be technically possible, but they are highly complex in terms of construction and thus difficult to maintain, and they have negative effects on the vehicle weight and result in significantly increased costs. This is avoided according to the improved concept.

It should further be noted that a higher system voltage exacerbates the problem outlined, as already mentioned in the introduction, as the energy quantity stored in a capacitor increases with the square of the capacitor voltage. In concrete terms, this means that if the system voltage increases from 400V to 800V, then the sum of the capacitances permitted per HV potential HV1, HV2 is only a quarter of the previous value. This is inconvenient as the higher voltage level is often also associated with shorter switching times of semiconductor elements in order to limit thermal switching losses occurring during switching. On the other hand, however, shorter switching times lead to steeper switching flanks, these to more interferences that in turn have to be met with anti-interference capacitors, which leads to a requirement for larger Y capacitors.

As already mentioned above, high-voltage systems of motor vehicles are II or IT systems, i.e., they have no relationship to the vehicle mass M, such that the HV potentials can ideally be regarded as undefined or "floating" with regards to the vehicle mass M. As all isolating materials used in reality have a final electrical resistance, however, a high-resistance connection of both HV potentials HV1, HV2 to the vehicle mass M is present in systems of this kind too. These undesirable resistances, which are not incorporated as a component, but are instead purely parasitic, are also called isolation resistances. In FIG. 1, these are schematically depicted as a first isolation resistance RI1 between the first HV potential HV1 and the vehicle mass M and as a second isolation resistance RI2 arranged between the second HV potential HV2 and the vehicle mass M.

As the isolation resistances RI1, RI2 respectively cannot fall short of a certain value, as the protecting character of the II or IT systems no longer exists, the isolation resistances RI1, RI2 are measured by means of an isolation measuring device.

As can be seen in FIG. 1, the isolation resistances RI1, RI2 represent a voltage divider over the entire HV voltage between the HV potentials HV1, HV2. In the course of a vehicle lifespan, a change of the isolation resistances RI1, RI2 usually occurs, principally owing to ageing, respective worsening, of the isolation materials. While the isolation resistances RI1, RI2 at both HV potentials HV1, HV2 are usually approximately the same in the case of a new vehicle and likewise usually worsen to the same extent, it can nevertheless occur that one of the isolation resistances RI1, RI2 changes faster than the other, which leads to what is referred to as an unbalanced load or "unbalance" of the isolation resistances RI1, RI2.

In an ideal new vehicle, in which both isolation resistances RI1, RI2 are equally large, the HV voltage is equally split over the voltage divider, such that the voltages U1, U2 between the respective HV potentials HV1, HV2 and vehicle mass M are equally large in magnitude. If the unbalanced load described above now occurs, then the resistance relationship thus shifts, and so too the distribution of the HV voltage, such that one of the voltages U1, U2 is greater than the other.

As can be seen in FIG. 1, the Y capacitors C1, C2 lie in parallel to the respective isolation resistances RI1, RI2, and are thus charged to the respective voltage U1, U2 that is introduced to the isolation resistances RI1, RI2 by the voltage divider. If the relationship of the isolation resistances RI1, RI2 to each other shifts, then the voltage U1, U2 on the capacitors C1, C2 also shifts. Due to the generally relatively high isolation resistances RI1, RI2 in systems of this kind, it can occur in the case of extremely unbalanced loads that almost the entire voltage of the high-voltage system 1, and thus a voltage totaling |U1|+|U2|, lies on one of the two capacitors C1, C2. This means that, without the improved concept, the maximum HV voltage occurring in the system must be drawn on in the case of the maximum Y capacitors C1, C2, as the voltage can fall approximately entirely over one of the Y capacitors C1, C2 in the worst-case scenario.

Because, as mentioned above, the voltage having the square enters the energy stored in the capacitor, this would be significantly disadvantageous, and leads, for example, to a situation in which, for systems having up to 850V system voltage, 425V cannot be used for the calculation, but rather the full 850V. The maximum Y capacitance per HV potential HV1, HV2 resulting from this would then be so low that EMV requirements could not be met, substantial thermal losses would be expected due to longer switching times, the system voltage would have to be decreased or, as mentioned above, significant construction, and thus expensive and load-capacitance-reducing measures would have to be taken.

According to a high-voltage system 1 as shown in FIG. 1, this problem can be solved by determining a maximum "unbalanced load limit" permitted in the system, and using it for the design. The high-voltage system 1 can, for example, be turned off and/or other risk-reducing measures can be taken when this limit is reached.

A voltage (from which an expected value or reference value is known), the relationship of the voltages U1, U2 of the two HV potentials HV1, HV2 according to vehicle mass M, the relationship of partial voltages of the high-voltage system 1 or the relationship of the isolation resistances is determined, for example, as a value characterizing the energy quantity in a Y capacitor in the high-voltage system 1. This can, for example, be carried out via isolation resistance measurements, an isolation resistance relationship measurement, a voltage relationship measurement, one or more voltage measurements, or other suitable measures. If the pre-set relationship is damaged or a threshold value is exceeded or fallen short of by the value characterizing a threshold value, then this leads to a corresponding comparison result that is also described as first information relating to the electrical unbalanced load here. This first information is optionally only provided by the vehicle.

A reaction to the first information follows according to a development. Only a warning (e.g., a "complete the current journey at most" warning) is given, for example. The automatic (partial) switching-off of the high-voltage system 1 optionally occurs. In a cascade method, however, the characterizing value can also be compared with one or more further threshold values in order to obtain second, third, etc. information. A series of measures can be initiated on the basis of this information. A (partial) switching-off can thus occur with advance warning, for example, if first a first threshold value and then a second threshold value is then exceeded or fallen short of by the characterizing value.

In the case of an 850V system and a permitted "unbalanced load limit" of 1:3, the entire voltage of 850V would not then need to be drawn on for the design, and thus limit of the Y capacitors C1, C2, for example, but rather only ¾ thereof, that is to say 637V. Because, as already mentioned, the voltage enters into the calculation quadratically, a factor of 1.78 thus results, by which the Y capacitors C1, C2 can be bigger than is possible without this measure.

The improved concept thus enables the observation of the specified limit values corresponding to a maximum energy quantity to be ensured, but simultaneously enables larger Y capacitors C1, C2 to be used than would otherwise be possible.

A fixed unbalanced load limit value can be defined in the design for this purpose, for example, whose observation is then monitored by means of the monitoring unit 2. However, this is disadvantageous, in particular, in the commercial vehicle sector, where a number of different configurations of the HV system exist, as it would always be necessary to design for the worst-case vehicle configuration in the case of a static unbalanced load limit value, such that base vehicles with only a low Y capacitance would consequently have to be serviced far too early or would be taken out of operation. If a base vehicle has a Y capacitance of 400 nF per vehicle, for example, then a vehicle equipped for the maximum can certainly have 900 nF. As per $W_{capacitor}=½·C·U_2$, a higher voltage (and thus unbalanced load) on the Y capacitors of the respective potentials could be permitted in the base vehicle due to the smaller capacitance than in the vehicle equipped for the maximum.

In order to guarantee maximum vehicle accessibility, however, it is advantageous to program the unbalanced load limit value or a value characterizing a threshold value relating to the energy quantity in a respective Y capacitor into the vehicle individually, or to calculate it dynamically in the vehicle, for example during production of the vehicle if the capacitances of the rebuilt Y capacitors C1, C2 are known. The latter can be carried out, for example, occur in that every component of the high-voltage system 1 sends information about the Y capacitors assigned to them or contained by them to a computing unit of the high-voltage system 1, and the computing unit adds up all the capacitances in terms of potential and then calculates the unbalanced load limit value or threshold value for the system voltage inherent to the vehicle. A look-up table can alternatively be deposited in the computing unit or at another position, the look-up table having the Y capacitors for the components of the high-voltage system 1. The described dynamic calculation of the unbalanced load limit is particularly advantageous with regards to possible subsequent changes of the components.

In practice, (new) commercial vehicles are often sold for write-off purposes after three years and re-built by the subsequent owner. For the high-voltage system, this may mean, for example, that a second battery is installed, a crane is swapped for a cooling structure or the like. Significant changes thus result in the high-voltage system, and thus on the Y capacitors located in the system. The previously specified dynamic calculation of the unbalanced load limit or the limit value or the limit values is thus to be recommended.

In FIG. 2, a further exemplary embodiment of a high-voltage system 1 for an electric motor vehicle is schematically depicted. The high-voltage system 1 of FIG. 2 is based on that of FIG. 1.

In the high-voltage system 1 of FIG. 2, it is possible to actively influence the isolation resistances, and thus the voltages U1, U2 or their relationship. This can be achieved by resistances R1, R2 that are able to be switched or controlled by means of respective switching devices S1, S2 being introduced between the respective HV potentials HV1, HV2, and vehicle mass M, and the unbalanced load relationship thus being actively influenced via targeted control or switching-on and/or -off of the resistances R1, R2. For clarity, only one resistance R1, R2 is depicted in FIG. 2. However, several resistances that are able to be switched or controlled can, and optionally one or more resistances that cannot be changed, can actually also be represented thereby.

It is alternatively or additionally possible not only to compensate for or control the isolation resistances in terms of potential, but to introduce, in a fixed or switchable manner, a resistance in general on the two HV potentials HV1, HV2, the resistance being selected such that an unbalanced load of this kind cannot occur at any point in time even if a pre-defined warning threshold is reached, e.g. 500 Ω/V, or if a pre-defined threshold for switching off is reached, e.g., 100 Ω/V. Making it possible for these resistances to be switched has the advantage that the actual isolation resistances RI1, RI2 can still be certainly determined if resistances are switched off.

It can especially be provided that resistances that are able to be switched are introduced into a base vehicle from the outset between the high voltage potentials HV1 and HV2, on the one hand, and the vehicle mass M, on the other hand. There is no limit with regards to the number of resistances to be employed here. Further resistances R1, R1", etc. that are able to be switched could, for example, be switched in parallel to the resistance R1. The same applies to the resistance R2 that is able to be switched. The individual resistances could preferably be switched in parallel to the respective isolation resistances RI1, RI2 individually or in groups. The parallel resistance can thus be changed to the isolation resistance, and thus the entire resistance of the vehicle mass to the respective high-voltage connection HV1, HV2. An unbalanced load can thus be compensated for depending on the configuration and/or depending on age by the corresponding resistances being connected or disconnected in a simple manner.

Alternatively, or additionally, one or more warning thresholds can be provided for a threshold for switching off, via which the driver or a third party can be notified that a corresponding unbalanced load is present, and optionally that servicing is necessary in order to avoid a forced switching-off.

Alternatively, or additionally, a maximum charging voltage of the high voltage battery, and consequently the maximum possible voltage on the Y capacitors C1, C2, can be limited, in particular in the case of isolation resistance unbalanced loads that are already very high, such that further travel or travel to a garage is enabled. Energy can optionally be destroyed here to a certain extent by the high-voltage system 1 being temporarily partially switched off, for example by means of a heater or air-conditioning or the like. The battery voltage is thus reduced and the system voltage is thus reduced so far that an operation of the entire high-voltage system 1 is possible, as the entire voltage, and thus the voltages prevailing on the Y capacitors C1, C2 resulting from the then extremely unbalanced load are low enough to maintain the limits.

Provision can further be made to approximately predict the two isolation resistances RI1, RI2 or voltages U1 or U2 by means of an extrapolation method in order to correspondingly emit a warning in advance.

The points explained in relation to FIG. 2 can be provided independently of or in combination with the monitoring, and optionally the switching-off, as carried out in relation to FIG. 1.

In FIG. 3, a further exemplary embodiment of a high-voltage system 1 for an electric motor vehicle is schematically depicted.

In the embodiment of FIG. 3, a socket P1, P2 is provided for each HV potential HV1, HV2 for manually introducing correction resistances RK1, RK1 between the vehicle mass M and the respective HV potential HV1, HV2, for example in a garage. A worker can be supported together with diagnosis routines in restoring the balance of the isolation resistances, such that the pre-determined requirements of the maximum energy in the Y capacitors C1, C2 can be observed.

In principle, the sockets P1, P2 can be arranged in any location in the high-voltage system 1, preferably outside the high-voltage battery. The sockets P1, P2 can, for example, be located under a service flap, where fuses can also be located, for example.

The worker can be supported in setting the correction resistances RK1, RK2 by the vehicle or vehicle software. It is, in particular, also possible to monitor which of the isolation resistances RI1, RI2 is currently changing faster in order to then undertake preventative overcompensation.

One or more safety resistances RS1, RS2 can optionally be provided in series to the corresponding socket P1, P2 for each HV potential HV1, HV2. These can be seen as passenger protection measures, for example covering cases where the HV potentials HV1, HV2 are accidentally bridged or the like. The sum of the respective correction resistance RK1, RK2 and the respective safety resistances RS1, RS2 is measured here, in particular, in such a way that the loss on the other respective HV potential HV1, HV2 can be corrected.

In a particularly simple embodiment of the method according to the invention or the high-voltage system according to the invention, it can be provided that only a single voltage is measured at any of the isolation resistances or the resistances switched parallel to the latter as a value characterizing the energy quantity of a Y capacitor. This is because, as the entire voltage of the high voltage system and optionally also the configuration of the resistances switched in parallel to the isolation resistances is known, the voltages on the two Y capacitors can necessarily be derived. An unbalanced load can thus be recognized if this single measured voltage value is compared with a threshold value or tolerance range. If a threshold value of this kind is exceeded, then a reaction can be made with an adequate measure in order, for example, to reduce the energy quantity in a Y capacitor, or simply to provide a warning.

Although the invention has been illustrated and described in detail by way of preferred embodiments, the invention is not limited by the examples disclosed, and other variations can be derived from these by the person skilled in the art without leaving the scope of the invention. It is therefore clear that there is a plurality of possible variations. It is also clear that embodiments stated by way of example are only really examples that are not to be seen as limiting the scope, application possibilities or configuration of the invention in any way. In fact, the preceding description and the description of the figures enable the person skilled in the art to implement the exemplary embodiments in concrete manner, wherein, with the knowledge of the disclosed inventive concept, the person skilled in the art is able to undertake various changes, for example, with regard to the functioning or arrangement of individual elements stated in an exemplary embodiment without leaving the scope of the invention, which is defined by the claims and their legal equivalents, such as further explanations in the description.

LIST OF REFERENCE SIGNS 1 high-voltage system
2 monitoring unit
HV1, HV2 high-voltage potential connections
M mass connection
RI1, RI2 isolation resistances
C1, C2 Y capacitors
U1, U2 voltages
S1, S2 switching devices
R1, R2 resistances
P1, P2 sockets
RK1, RK2 correction resistances
RS1, RS2 safety resistances

The invention claimed is:

1. A method, comprising:
   determining first information about an electrical unbalanced load of a vehicle having an at least partially electrified drive train having at least one high-voltage system, by
      determining a value characterizing an energy quantity of at least one Y capacitor of the high-voltage system, wherein the value is a voltage of the high-voltage system, a partial voltage of the high-voltage system, value related to the partial voltage of the high-voltage system, a relationship of voltages of the high-voltage system, or a relationship of isolation resistances of the high-voltage system;
   providing a first threshold value related to a capacitance of the at least one Y capacitor; and
   determining the first information about the electrical unbalanced load by comparing the determined characterizing value with the provided first threshold value; and
   introducing first and second correction resistances, depending on the determined first information, to reduce an energy quantity of one of the at least one Y capacitor that affects the unbalanced load, wherein the introducing of the first and second correction resistances comprises manually introducing the first correction resistance into a first socket of the at least one high-voltage system and manually introducing the second correction resistance into a second socket of the at least one high-voltage system.

2. The method of claim 1, wherein the provision of the first threshold value includes determining a total capacitance of the at least one Y capacitor and determining the first threshold value depending on the total capacitance.

3. The method of claim 1, further comprising:
   determining second information about the electrical unbalanced load by comparing the determined characterizing value with a provided second threshold value different from the first threshold value relative to the capacitance of the at least one Y capacitor.

4. The method of claim 3, further comprising:
   introducing a second measure, which is a warning, depending on the second information that does not reduce the energy quantity of the Y capacitor affecting the unbalanced load.

5. The method of claim 1, wherein the first and second sockets are arranged outside of a battery of the at least one high-voltage system.

6. The method of claim 5, wherein the first and second sockets are arranged under a service flap of the vehicle along with fuses of the vehicle.

* * * * *